(12) United States Patent
Yamada et al.

(10) Patent No.: US 6,496,968 B1
(45) Date of Patent: Dec. 17, 2002

(54) HIERARCHICAL WIRING METHOD FOR A SEMICONDUCTOR INTEGRATED CIRCUIT

(75) Inventors: Hiromitsu Yamada, Hadano (JP); Katsuaki Hongyo, Hadano (JP); Masato Mogaki, Hadano (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/376,469

(22) Filed: Aug. 18, 1999

(30) Foreign Application Priority Data

Aug. 18, 1998 (JP) .......................................... 10-247856

(51) Int. Cl.$^7$ .............................................. G06F 17/50
(52) U.S. Cl. .......................................... 716/12; 716/14
(58) Field of Search ........................................ 716/1–14

(56) References Cited

U.S. PATENT DOCUMENTS

| | | | |
|---|---|---|---|
| 4,688,070 A | * 8/1987 | Shiotari et al. | 257/202 |
| 4,964,057 A | * 10/1990 | Yabe | 716/12 |
| 4,974,049 A | * 11/1990 | Sueda et al. | 257/204 |
| 5,231,589 A | * 7/1993 | Itoh et al. | 716/12 |

FOREIGN PATENT DOCUMENTS

JP 406045443 * 2/1994 .................. 716/12

* cited by examiner

Primary Examiner—Vuthe Siek
Assistant Examiner—Sun James Lin
(74) Attorney, Agent, or Firm—Antonelli, Terry, Stout & Kraus, LLP

(57) ABSTRACT

In a computer-aided design (CAD) method for the intra-chip wiring in a hierarchical implementation design of a semiconductor integrated circuit, wiring pattern spaces from block edge terminals are guaranteed while preventing any wiring detour in inter-block nets. Logical line connecting information and implementation information such as contours of parts and terminal positions are inputted from a logical file and a library to extract block edge terminals so as to define a block boundary in accordance with layout positions of parts to be allocated. On the block boundary defined, one virtual terminal is generated for each block edge terminal to dispose wirings between the block edge terminals and the associated virtual terminals. An intra-block net wiring is then achieved without a short circuit to the wirings between the block edge terminals and the associated virtual terminals. Finally, the virtual terminals and the wiring pattern between the block edge terminals and the associated virtual terminals are deleted.

6 Claims, 4 Drawing Sheets

HIERARCHICAL WIRING METHOD FOR A SEMICONDUCTOR INTEGRATED CIRCUIT

BACKGROUND OF THE INVENTION

The present invention relates to a wiring method for an implementation design of a semiconductor integrated circuit (IC), and in particular, to a hierarchical wiring method suitable for a hierarchical implementation design in which lower and upper hierarchical layers are employed to hierarchically design a configuration of the semiconductor integrated circuit.

In the hierarchical implementation design of a semiconductor integrated circuit, when a block is implemented in a lower hierarchical layer (inter-block wiring), wirings between terminals, i.e., block edge terminals of a net to be connected to external terminals external to the blocks, and the external terminals, that is, external wirings including inter-block wirings are not ordinarily established since terminal positions as the connecting destinations outside the block are not determined in this stage. The net indicates in this specification wirings connecting equipotential terminals to each other.

Assume in the operation that a wiring pattern in the inter-block net is generated, for example, to enclose a block edge terminal and blocks are thereafter arranged in an upper layer of a chip or the like. In this situation, there arises a problem when a block in the upper layer is to be connected to the block in the lower layer. Namely, it is impossible to draw or to elongate a wiring pattern from the block edge to a position outside the block.

To solve this problem, JP-A-8-129574 describes a technology broadly known as an example of the conventional technology concerning the hierarchical implementation method for a semiconductor integrated circuit.

In the technology of JP-A-8-129574, the wiring is conducted in a chip layer as an upper layer prior to the intra-block wiring. Wiring pattern data used in this operation is supplied to the block implementation, namely, the wiring pattern is not used in the intra-block wiring to thereby guarantee that a wiring pattern is drawn from a block edge in a chip implementation.

SUMMARY OF THE INVENTION

The prior art requires the determination of block positions in the chip before the block implementation. Consequently, each time the block layout is altered in the chip, the intra-block wiring is required to be changed and hence the implementation design time is elongated.

It is therefore an object of the present invention to provide a wiring method which solves the conventional problem above and in which when achieving the intra-chip wiring in a hierarchical implementation design for a semiconductor integrated circuit (chip) including high-density wiring layers, wiring pattern spaces to block edge terminals are guaranteed while preventing increase in delay and deterioration in a wiring ratio due to a wiring detour between an inter-block net as well as elongation of the implementation design time. The wiring ratio indicates a ratio of actual wirings to the number of nets to be wired.

To achieve the object above, a hierarchical wiring method is provided in accordance with an aspect of the present invention. The method comprises, when achieving a hierarchical wiring of a semiconductor circuit in a hierarchical implementation design of the semiconductor integrated circuit, a step of extracting, when wiring an intra-block net to establish connections in a block in a lower layer, block edge terminals for terminals of a net to be connected to a position external to the block, a step of defining a rectangle circumscribing the block and determining the rectangle as a boundary of the block, a step of disposing, on four edges of the block, virtual terminals connected to block edge terminals, a step of automatically conducting wirings, prior to another net, between the block edge terminals to the associated virtual terminals thus disposed, automatically wiring thereafter all remaining intra-block nets, and a step of deleting, after the intra-block wirings are completely finished, all wiring patterns of nets connected to the virtual terminals disposed.

In accordance with another aspect of the present invention, there is provided a hierarchical wiring method for a semiconductor integrated circuit in a hierarchical implementation design of the semiconductor integrated circuit. The method includes, to wire an intra-block net to establish connections in a block in a lower layer when a plurality of wiring layers are provided, a step of extracting block edge terminals as terminals of a net to be connected to a position external to the block in the lower layer, a step of generating at least one virtual terminal of the block edge terminals in an upper layer in the proximity of the block edge, a step of automatically establishing wirings between the block edge terminals to the associated virtual terminals prior to another intra-block net, a step of automatically wiring thereafter all remaining intra-block nets by use of only wiring layers lower than the upper layer in which the virtual terminal is generated, and a step of deleting, after the intra-block wirings are completely finished, all wiring patterns of nets connected to the virtual terminals.

Other objects, features and advantages of the present invention will become apparent from the following description of the embodiments of the invention taken in conjunction with the accompanying drawings.

DESCRIPTION OF THE PREFERRED EMBODIMENTS

Figure 1:
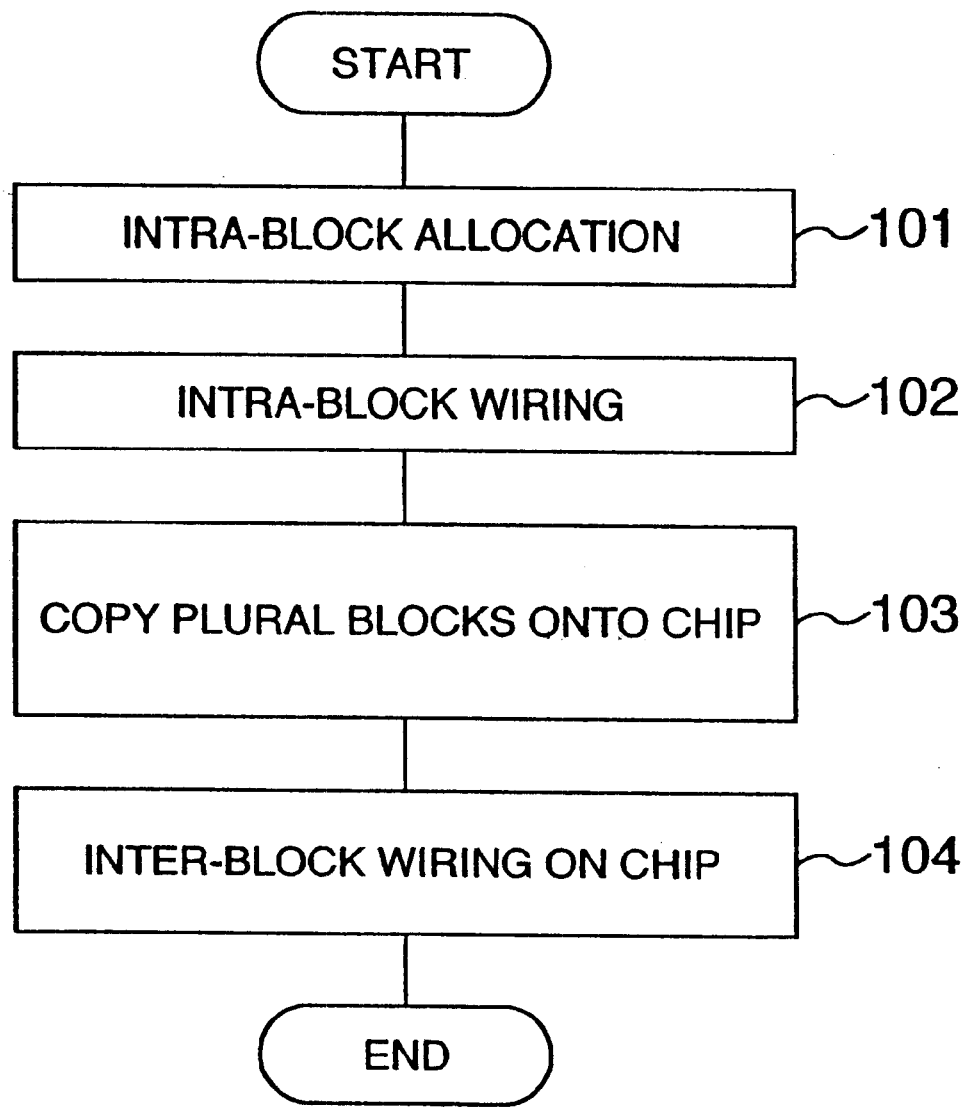
FIG. 1 is a flowchart for explaining the contents of processing of an embodiment of a hierarchical wiring method in accordance with the present invention.

Referring now to the drawings, description will be given in detail of embodiments of a hierarchical wiring method in accordance with the present invention.

Figure 2:
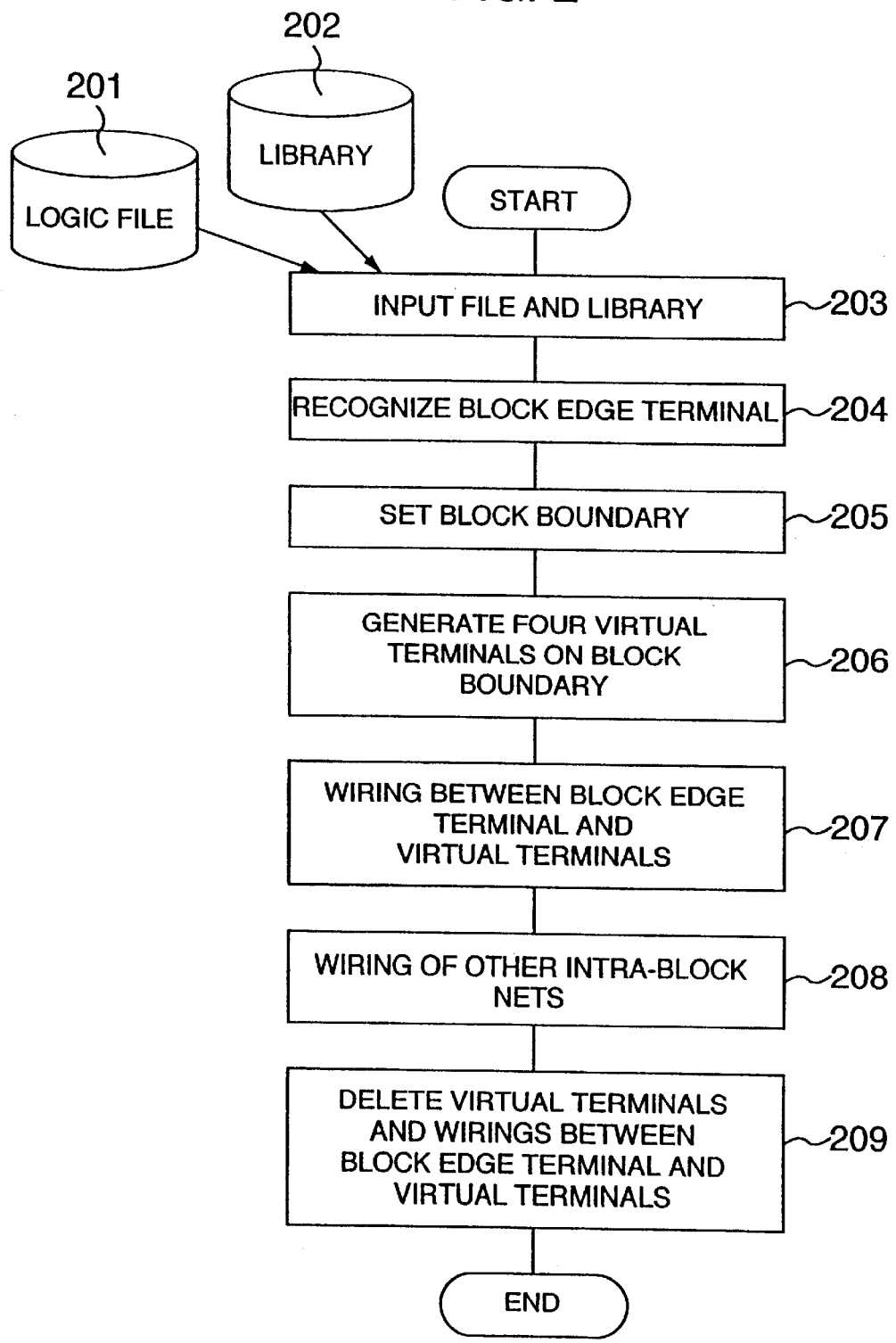
FIG. 2 is a flowchart for explaining the contents of processing of an embodiment of an intra-block wiring method in accordance with the present invention.

First, description will given of the contents of processing of an embodiment of the present invention by referring to the processing flows shown in FIGS. 1 and 2. The processing flows are executed by a computer using a computer aided design (CAD) tool.

In this embodiment, the wiring can be achieved in two layers as an example including a horizontal wiring layer and a vertical wiring layer. There may be employed multi-layer wiring board configured with a plurality of layer sets, each set including a horizontal wiring layer and a vertical wiring layer.

Referring to FIG. 1, description will be given of a design processing flow ranging from a block implementation (layout) to a chip implementation.

(1) For a single block on one wiring layer, intra-block parts are allocated (step 101).

(2) An intra-block wiring is conducted (step 102).

Later, description will be given in detail of the intra-block wiring method by referring to FIG. 2.

(3) With information of layout (coordinates) and wiring pattern information kept in a file, a plurality of blocks are copied onto a chip as an object of this design. Values of coordinates of the wiring pattern are converted into coordinate values of a coordinate system of the chip in accordance with block layout positions (step 103).

(4) An inter-block net is wired on the chip. This completes the entire wiring in the chip (step 104).

Referring next to FIG. 2, description will be given of an intra-block wiring method of step 102.

(1) Necessary information is read from a chip and block logic file 201 and a library 202 containing therein layout information such as contours of parts and terminal coordinate values (step 203).

(2) From net list information in a chip logic file, there are extracted identifiers (IDs) and pin names of parts to which block edge terminals are assigned (step 204).

(3) In accordance with a minimum coordinate point (minimum x-coordinate value, minimum y-coordinate value) and a maximum coordinate point (maximum x-coordinate value, maximum y-coordinate value) of the layout positions of cells allocated in the block, a rectangle circumscribing the block is obtained to accordingly define a boundary of the block (step 205).

(4) For each of the block edge terminals attained in step 204, there are generated virtual terminals for four edges, i.e., upper, lower, right, and left edges of the block boundary (step 206).

For each block edge terminal, only one virtual terminal is generated for an arbitrary point on each edge of the rectangle.

Figure 3:
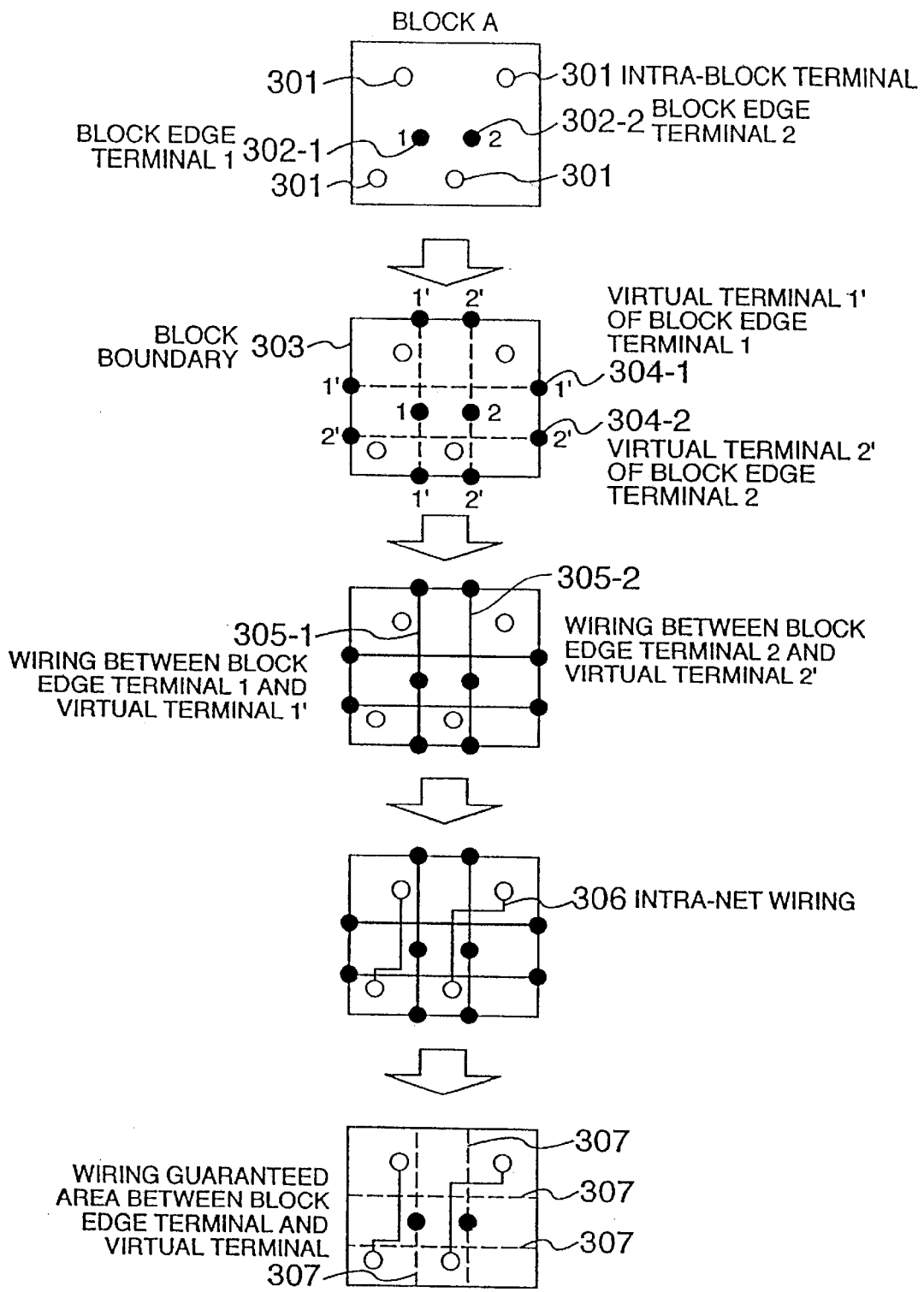
FIG. 3 is a diagram for explaining an intra-block wiring method.
Figure 4:
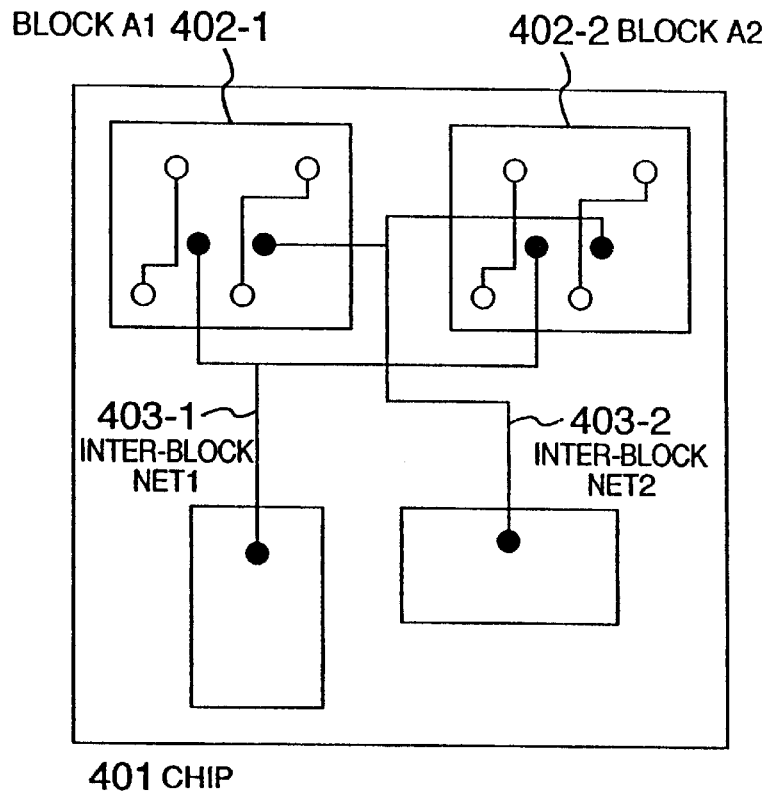
FIG. 4 is a diagram for explaining an inter-block wiring after a plurality of blocks are copied onto a chip.

Referring now to FIG. 3 showing an intra-block wiring method and FIG. 4 showing an inter-block wiring after a plurality of blocks are copied onto a chip, the configuration of FIG. 3 includes intra-block terminals 301, block edge terminals 302-1 and 302-2, a block boundary 303, virtual terminals 304-1 and 304-2 respectively of block edge terminals 302-1 and 302-2, wirings 305-1 and 305-2 between block edge terminals and virtual terminals, an intra-block net wiring 306, a wiring guaranteed area 307 between a block edge terminal and a virtual terminal and the construction of FIG. 4 includes a chip 401, blocks 402-1 and 402-2 obtained by copying a block A onto the chip, and inter-block nets 403-1 and 403-2.

In FIG. 3, a virtual terminal of block edge terminal 1 302-1 is generated at a position indicated as virtual terminal 1' 304-1 of block edge terminal 1 (on each edge).

For virtual terminals 1' of block edge terminal 1, there exists no hindrance for the wiring from block edge terminal 1 to the upper and lower edges of the block boundary. Therefore, a virtual terminal is generated on each horizontal edge at positions having the same x-coordinate value. From block edge terminal 1 to the right and left edges, block edge terminal 2 becomes as hindrance for the wiring. Consequently, when generating virtual terminals, the y-coordinate value is changed to avoid the hindrance. This also applies to virtual terminals 2' for block edge terminal 2.

As indicated by virtual points 304-1 and 304-2 in FIG. 3, the virtual terminals are generated such that the virtual terminals on the upper and lower block boundaries have the same x-coordinate value and those on the right and left block boundaries have the same y-coordinate value to the possible extent.

This leads to minimization in length of the wirings from a block edge terminal to the virtual terminals. When a hindrance exists in the vertical direction, the virtual terminal is shifted from the position having the x-coordinate value of the block edge terminal on the upper or lower edge to avoid the hindrance. When a hindrance exists in the horizontal direction, the virtual terminal is shifted from the position with the y-coordinate value of the block edge terminal on the right or left edge to avoid the hindrance.

(5) Wirings are conducted between the block edge terminal and the virtual terminals generated on the block boundary prior to other intra-block nets (step 207).

(6) After all wirings are completed between the block edge terminal and the virtual terminals, another net is wired in the block.

As indicated by intra-block net wiring 306, the wiring is arranged without any short-circuits to the wiring patterns already disposed between block edge terminals and associated virtual terminals (step 208).

(7) The virtual terminals generated in step 206 and the wiring patterns from the block edge terminals to the associated virtual terminals are deleted (step 209).

As a result, wiring pattern spaces from the block edge terminals to the block boundary are guaranteed.

In accordance with the method described above, there are guaranteed wiring pattern spaces in the inter-block wiring in a chip, namely, thanks to the spaces, the wirings connected to the block edge terminals can be extended from an intra-block area to an external area. Moreover, in accordance with a block allocating position and a connecting terminal position, there can be selected a wiring pattern space without detour from four types of guaranteed wiring pattern spaces.

Next, description will be given of the contents of processing of another embodiment including multiple layers for the wiring in accordance with the present invention. Namely, a horizontal wiring layer and a vertical wiring layer form a set of wiring layers and the embodiment includes a plurality of sets of wiring layers.

Figure 5:
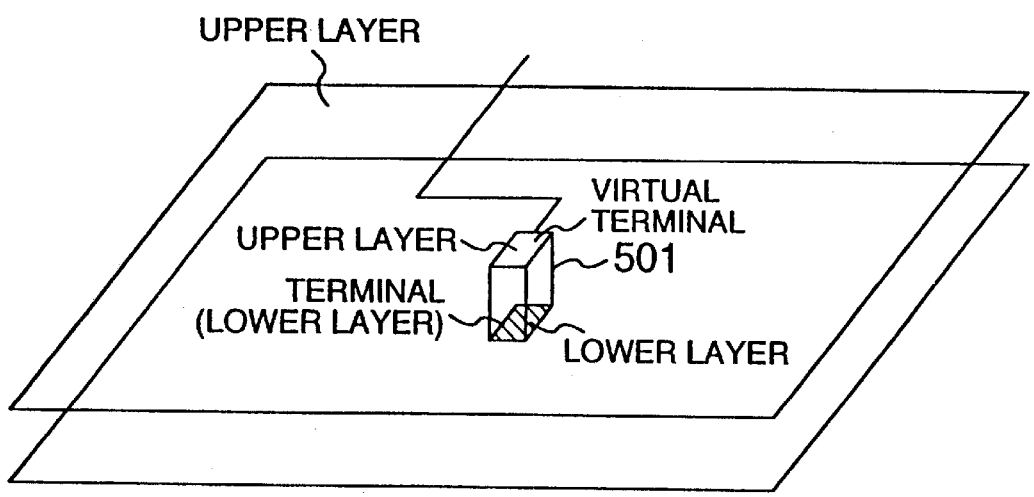
FIG. 5 is a diagram for explaining another embodiment of an inter-block wiring method in accordance with the present invention.

In place of processing of steps 205 and 206 of the embodiment above, one or more virtual terminals 501 are generated in this embodiment on an upper layer at a position possibly near an associated block edge terminal as shown in FIG. 5.

Subsequently, the intra-block net of step 208 of the embodiment above is wired by using only wiring layers lower than that of the virtual terminal.

When the wiring board is turned over, the block edge terminal is on an upper layer and the virtual terminal is on a lower layer and the intra-block net is wired by using only wiring layers higher than that of the virtual terminal.

Resultantly, it is possible to guarantee pattern spaces between the block edge terminal and associated virtual terminals on an upper layer. Using upper layers in the inter-block wiring in a chip, there is guaranteed to conduct wirings without detour. The steps of the wiring method shown in FIGS. 1 and 2 are stored as a computer-readable program on a recording media such as various types of disks and tapes, semiconductor memories, and the like. The program serves as a computer-aided design tool to implement the present invention.

As above, in accordance with the present invention, there can be guaranteed pattern spaces in a block from block edge terminals to external positions.

Moreover, the upper-layer wiring can be achieved without detour.

This prevents increase in delay and decrease in the wiring ratio due to the wiring detour in the interblock net. Moreover, wiring pattern spaces to block terminals can be guaranteed without elongating the implementation design time.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A computer-implemented method for hierarchically wiring a semiconductor integrated circuit in a hierarchical implementation design of the semiconductor integrated circuit, comprising the steps of:

extracting, when wiring an intra-block net to establish connections in a block in a lower layer, block edge terminals from an input logic file of an upper layer, the terminals being terminals of a net to be connected to a position external to the block;

obtaining a rectangle circumscribing the block in accordance with allocating positions beforehand determined in the block and defining the rectangle as a boundary of the block;

disposing, on four edges of the rectangular boundary of the block, block edge virtual terminals connected to block edge terminals respectively associated therewith;

automatically conducting wirings between the block edge terminals to the associated virtual terminals prior to an intra-block net;

automatically wiring thereafter all remaining intra-block nets;

deleting, after the intra-block wirings are completely finished, all wiring patterns of nets connected to the virtual terminals, to thereby provide wiring pattern spaces; and performing an inter-block wiring using said wiring pattern spaces, when wirings of inter-block nets for connection between blocks in the upper layer are carried out.

2. A hierarchical wiring method in accordance with claim 1, wherein the block edge virtual terminal is placed at an arbitrary position on an associated edge of the rectangular boundary.

3. A hierarchical wiring method in accordance with claim 1, further comprising the steps of:

representing each of the positions respectively in a horizontal direction and a vertical direction of the rectangular boundary of the block respectively by an x-coordinate value and a y-coordinate value;

each of the virtual terminals being shifted, when a hindrance is present, relative to the block edge terminal to a position nearest to an x-coordinate position of the block edge terminal to avoid the hindrance and/or relative to the block edge terminal to a position nearest to a y-coordinate position of the block edge terminal to avoid the hindrance, thereby setting the virtual terminals.

4. A computer-readable recording medium storing therein a program to execute by a computer a hierarchical wiring method for a semiconductor integrated circuit in a hierarchical implementation design of the semiconductor integrated circuit, wherein the program comprises the execution steps of:

extracting, when wiring an intra-block net to establish connections in a block in a lower layer, block edge terminals from an input logic file of an upper layer, the terminals being terminals of a net to be connected to a position external to the block;

obtaining a rectangle circumscribing the block in accordance with allocating positions beforehand determined in the block and defining the rectangle as a boundary of the block;

disposing, on four edges of the rectangular boundary of the block, block edge virtual terminals connected to block edge terminals respectively associated therewith;

automatically establishing wirings between the block edge terminals to the associated virtual terminals prior to an intra-block net;

automatically wiring thereafter all remaining intra-block nets;

deleting, after the intra-block wirings are completely finished, all wiring patterns of nets connected to the virtual terminals, to thereby provide wiring pattern spaces; and performing an inter-block wiring using said wiring pattern spaces, when wirings of inter-block nets for connection between blocks in the upper layer are carried out.

5. A computer-readable recording medium in accordance with claim 4, wherein the virtual terminal setting step of the program further comprising the step of:

setting, in the rectangular area of the block represented by x-coordinate and y-coordinate values, the virtual terminals to the rectangular boundary of the block at positions respectively shifted in a horizontal direction and a vertical direction of the rectangular boundary, when a hindrance is present, relative to the block edge terminal, the position being nearest to an x-coordinate position of the block edge terminal to be away from the hindrance and/or nearest to a y-coordinate position of the block edge terminal to be away from the hindrance.

6. A hierarchical wiring method for a semiconductor integrated circuit to be achieved by use of a computer in a hierarchical implementation design of the semiconductor integrated circuit, comprising the steps of:

extracting, in an operation to wire an intra-block net to establish connections in a block in a lower layer when a plurality of wiring layers are provided, block edge terminals from an input logic file of an upper layer, the terminals being terminals of a net to be connected to a position external to the block;

generating at least one virtual terminal of the block edge terminals in an upper layer in the proximity of the block edge terminals in accordance with allocating positions previously determined in the block;

automatically establishing wirings between the block edge terminals to the associated virtual terminals prior to an intra-block net;

automatically wiring thereafter all remaining intra-block nets by use of only wiring layers lower than the upper layer in which the virtual terminal is generated;

deleting, after the intra-block wirings are completely finished, all wiring patterns of nets connected to the virtual terminals to thereby provide wiring pattern spaces; and performing an inter-block wiring using said wiring pattern spaces, when wirings of inter-block nets for connection between blocks in the upper layer are carried out.

* * * * *